United States Patent
Lee et al.

(10) Patent No.: US 7,331,566 B2
(45) Date of Patent: Feb. 19, 2008

(54) NITRIDE SEMICONDUCTOR LIGHT EMITTING DEVICE

(75) Inventors: Jae Hoon Lee, Kyungki-do (KR); Jeong Tak Oh, Kyungki-do (KR); Jin Sub Park, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 20 days.

(21) Appl. No.: 10/998,922

(22) Filed: Nov. 30, 2004

(65) Prior Publication Data

US 2006/0054917 A1    Mar. 16, 2006

(30) Foreign Application Priority Data

Sep. 14, 2004  (KR) ...................... 10-2004-0073558

(51) Int. Cl.
*H01L 33/00* (2006.01)

(52) U.S. Cl. ......... 254/94; 257/E33.028; 257/E33.049; 257/96

(58) Field of Classification Search ........ 257/E33.064, 257/E33.028, 13–15, 18, 94–97, 79, E33.049
See application file for complete search history.

(56) References Cited

U.S. PATENT DOCUMENTS

| | | | |
|---|---|---|---|
| 5,548,138 A |  | 8/1996 | Tanimoto et al. |
| 5,563,422 A |  | 10/1996 | Nakamura et al. |
| 6,172,382 B1 | * | 1/2001 | Nagahama et al. ........... 257/94 |
| 6,479,836 B1 | * | 11/2002 | Suzuki et al. .................. 257/15 |
| 2003/0020061 A1 | * | 1/2003 | Emerson et al. ............... 257/14 |
| 2003/0127658 A1 | * | 7/2003 | Sheu et al. .................... 257/79 |
| 2005/0045906 A1 | * | 3/2005 | Tu et al. ...................... 257/103 |

FOREIGN PATENT DOCUMENTS

KR    2002-0066578    8/2002

OTHER PUBLICATIONS

Margalith et al. Indium Tin Oxide Contacts to Gallium Nitride Optoelectronic Devices. Applied Physics Letters, vol. 74, No. 26, (1999).*
Ambacher et al. Two-dimensional Electron Gases Induced by Spontaneous and Piezoelectric Polarization Charges in N- and Ga-face AlGaN/GaN heterostructures. Journal of Applied Physics, vol. 85, No. 6, (1999).*

* cited by examiner

*Primary Examiner*—Matthew C. Landau
(74) *Attorney, Agent, or Firm*—Lowe Hauptman Ham & Berner

(57) ABSTRACT

A nitride semiconductor light emitting device and a method of manufacturing the same are disclosed. The nitride semiconductor light emitting device comprises an n-type nitride semiconductor layer formed on a substrate, an active layer formed on the n-type nitride semiconductor layer, a p-type nitride semiconductor layer formed on the active layer, an undoped GaN layer formed on the p-type nitride semiconductor layer, an AlGaN layer formed on the undoped GaN layer to form a two-dimensional electron gas (2DEG) layer at a bonding interface between the AlGaN layer and the undoped GaN layer, and an n-side electrode and a p-side electrode respectively formed on the n-type nitride semiconductor layer and the AlGaN layer to be connected to each other. As a hetero-junction structure of GaN/AlGaN is formed on the p-type nitride semiconductor layer, contact resistance between the p-type nitride semiconductor layer and the p-side electrode is enhanced by virtue of tunneling effect through the 2DEG layer.

4 Claims, 4 Drawing Sheets

NITRIDE SEMICONDUCTOR LIGHT EMITTING DEVICE

RELATED APPLICATIONS

The present application is based on, and claims priority from, Korean Application Number 2004-73558, filed Sep. 14, 2004, the disclosure of which is incorporated by reference herein in its entirety.

BACKGROUND OF THE INVENTION

1. Field of the Invention

The present invention relates to a nitride semiconductor light emitting device, and, more particularly, to a high brightness nitride based semiconductor light emitting device, designed to lower operating voltage and to enhance electric current distribution effects, and a method of manufacturing the same.

2. Description of the Related Art

Generally, a nitride-based semiconductor is a material with a relatively large energy band gap (for example, in case of a GaN semiconductor, an energy band gap of about 3.4 eV), and is used for photodiodes for emitting light in a short wavelength range of blue light or green light. As for the nitride-based semiconductor, a material with the formula $Al_xIn_yGa_{(1-x-y)}N$ (where $0 \leq x \leq 1$, $0 \leq y \leq 1$, $0 \leq x+y \leq 1$) is generally used.

However, since the nitride semiconductor has a relatively large energy band gap, there is a difficulty in achieving an ohmic contact with electrodes therein. Particularly, contact resistance between a p-side electrode and a p-type nitride semiconductor is increased due to the larger energy band gap of the p-type- nitride semiconductor, thereby increasing the operating voltage of the device, which results in an increase of heat generation thereof.

Accordingly, it is necessary to provide a method for enhancing the ohmic contact when forming the p-side electrode. Additionally, since a portion formed with the p-side electrode acts as a main light-emitting surface in a typical non-flip chip structure, the above method for enhancing the ohmic contact has a technological restriction in that transmission of light must be ensured.

As to a conventional method satisfying the requirement, U.S. Pat. No. 5,563,422 entitled "Nitride gallium-based III-IV compound semiconductor device and method of manufacturing the same," which is assigned to Nichia Chemical Industry Limited, discloses a transparent electrode layer using a bi-layer of Ni/Au. FIG. 1 shows a light emitting device according to an embodiment of the disclosure.

As shown in FIG. 1, a conventional nitride semiconductor light emitting device 10 comprises an n-type GaN nitride layer 12, a GaN/InGaN active layer 13 having a multi-well structure, and a p-type GaN nitride layer 14, which are sequentially formed on a sapphire substrate 11 in this order. In the nitride semiconductor light emitting device 10, some portion of the p-type GaN nitride layer 14 and the GaN/InGaN active layer 13 is removed to expose a portion of the n-type GaN nitride layer 13.

After forming an n-side electrode 19a on the n-type GaN nitride layer 12 and a transparent electrode 18 made of Ni/Au for forming the ohmic contact on the p-type GaN nitride layer 14, a p-side bonding electrode 19b is formed. The transparent electrode 18 is a translucent layer for enhancing contact resistance, and can be formed through a deposition process of a bi-layer of Ni/Au and a subsequent annealing treatment.

In view of formation of the ohmic contact and enhancement of electric current injection efficiency, the transparent electrode 18 is preferred over a conventional ITO electrode. However, although a NiO layer having a relatively high translucency is formed by means of the annealing treatment, the transmittance thereof is 60% at most, and thus, the transparent electrode 18 has a lower light emitting efficiency, compared with the conventional ITO electrode.

In order to ensure high transmittance, the thickness (100 μm) of the Ni/Au transparent electrode must be restricted, causing a limitation in sufficient enhancement of the electric current injection efficiency. Furthermore, in order to additionally enhance the ohmic contact, it is necessary to dope a high concentration p-type impurity, such as Zn, Be, Mg and Cd, on the top surface of the p-type GaN nitride layer. However, an excessive amount of the p-type impurity causes reduction of crystallinity.

Accordingly, it is necessary to provide a new light emitting device, which can sufficiently enhance the ohmic contact and electric current distribution efficiency even with the conventional ITO electrode, and a method of manufacturing the same.

SUMMARY OF THE INVENTION

The present invention has been made in view of the above problems, and it is an object of the present invention to provide a high brightness nitride semiconductor light emitting device, which has a two-dimensional electron gas (2DEG) layer formed on a p-type clad layer having a p-side electrode formed thereon, thereby enhancing contact resistance and electric current injection efficiency.

It is another object of the present invention to provide a method of manufacturing the high brightness nitride semiconductor light emitting device.

In accordance with one aspect of the present invention, the above and other objects can be accomplished by the provision of a nitride semiconductor light emitting device, comprising: an n-type nitride semiconductor layer formed on a substrate; an active layer formed on the n-type nitride semiconductor layer; a p-type nitride semiconductor layer formed on the active layer; an undoped GaN layer formed on the p-type nitride semiconductor layer; an AlGaN layer formed on the undoped GaN layer to form a two-dimensional electron gas (2DEG) layer at a bonding interface between the AlGaN layer and the undoped GaN layer; and an n-side electrode and a p-side electrode respectively formed on the n-type nitride semiconductor layer and the AlGaN layer to be connected to each other.

The undoped GaN layer may have a thickness of 10~100 Å, and the AlGaN layer may have an Al content in the range of 10~50% under consideration of crystallinity. In this case, the AlGaN layer may have a thickness of 50~250 Å for forming the two-dimensional electron gas layer.

The AlGaN layer may be an undoped AlGaN layer or an n-type AlGaN layer doped with an n-type impurity, including Si.

The AlGaN layer may comprise oxygen as an impurity. Oxygen may act as an electron donor in the same fashion as Si. Although oxygen may be provided to the AlGaN layer by environmental oxidation, sufficient amount of oxygen may be added thereto by annealing the AlGaN layer in an atmosphere of oxygen.

The nitride semiconductor light emitting device may further comprise an ITO electrode between the p-side electrode and the AlGaN layer.

In accordance with another aspect of the present invention, the above and other objects can be accomplished by the provision of a method of manufacturing a nitride semiconductor light emitting device, comprising the steps of: forming an n-type nitride semiconductor layer on a substrate; forming an active layer on the n-type nitride semiconductor layer; forming a p-type nitride semiconductor layer on the active layer; forming an undoped GaN layer on the p-type nitride semiconductor layer; forming an AlGaN layer on the undoped GaN layer to form a two-dimensional electron gas (2DEG) layer at a bonding interface between the AlGaN layer and the undoped GaN layer; and forming an n-side electrode and a p-side electrode respectively formed on the n-type nitride semiconductor layer and the AlGaN layer to be connected to each other.

The method may further comprise the step of forming an ITO electrode between the p-side electrode and the AlGaN layer.

As such, according to the present invention, the two-dimensional electron gas (2DEG) layer is formed adjacent to a portion formed with the p-side electrode in order to reduce contact resistance. Particularly, the 2DEG layer has remarkably high electron mobility, thereby significantly enhancing the electric current distribution efficiency.

BRIEF DESCRIPTION OF THE DRAWINGS

The above and other objects, features and other advantages of the present invention will be more clearly understood from the following detailed description taken in conjunction with the accompanying drawings, in which:

FIG. 2b is a diagram illustrating a hetero-junction band structure of the nitride semiconductor light emitting device shown in FIG. 2a.

DESCRIPTION OF THE PREFERRED EMBODIMENTS

Preferred embodiments of the present invention will now be described in detail with reference to the accompanying drawings.

Figure 2A:
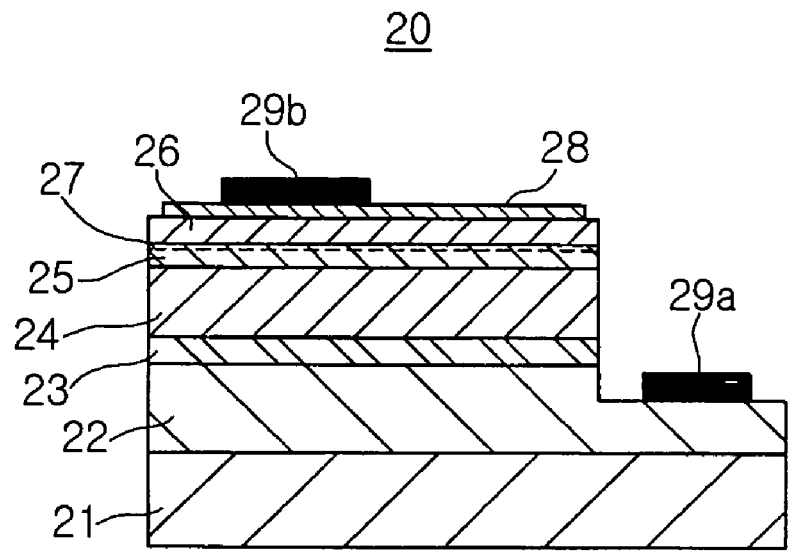
FIG. 2a is a sectional side elevation illustrating a nitride semiconductor light emitting device according to one embodiment of the present invention.
Figure 2B:
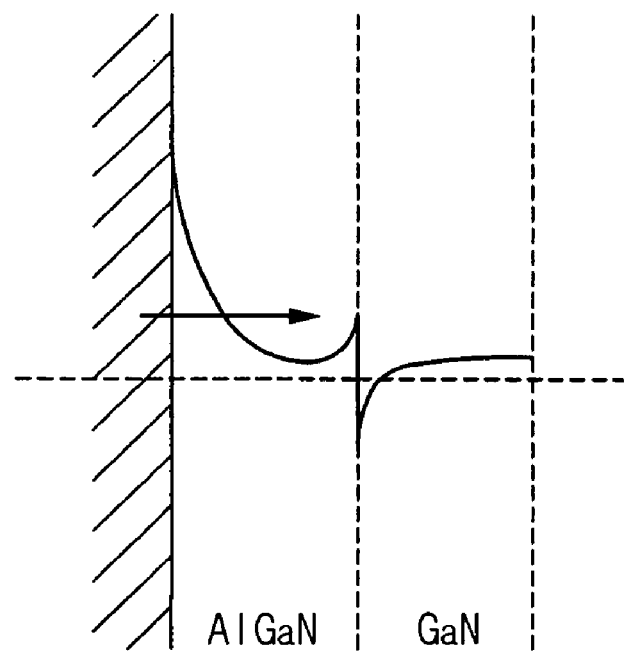

FIG. 2a is a sectional side elevation illustrating a nitride semiconductor light emitting device according to one embodiment of the present invention, and FIG. 2b shows an energy band structure of AlGaN/GaN layers of the nitride semiconductor light emitting device shown in FIG. 2a.

Figure 1:
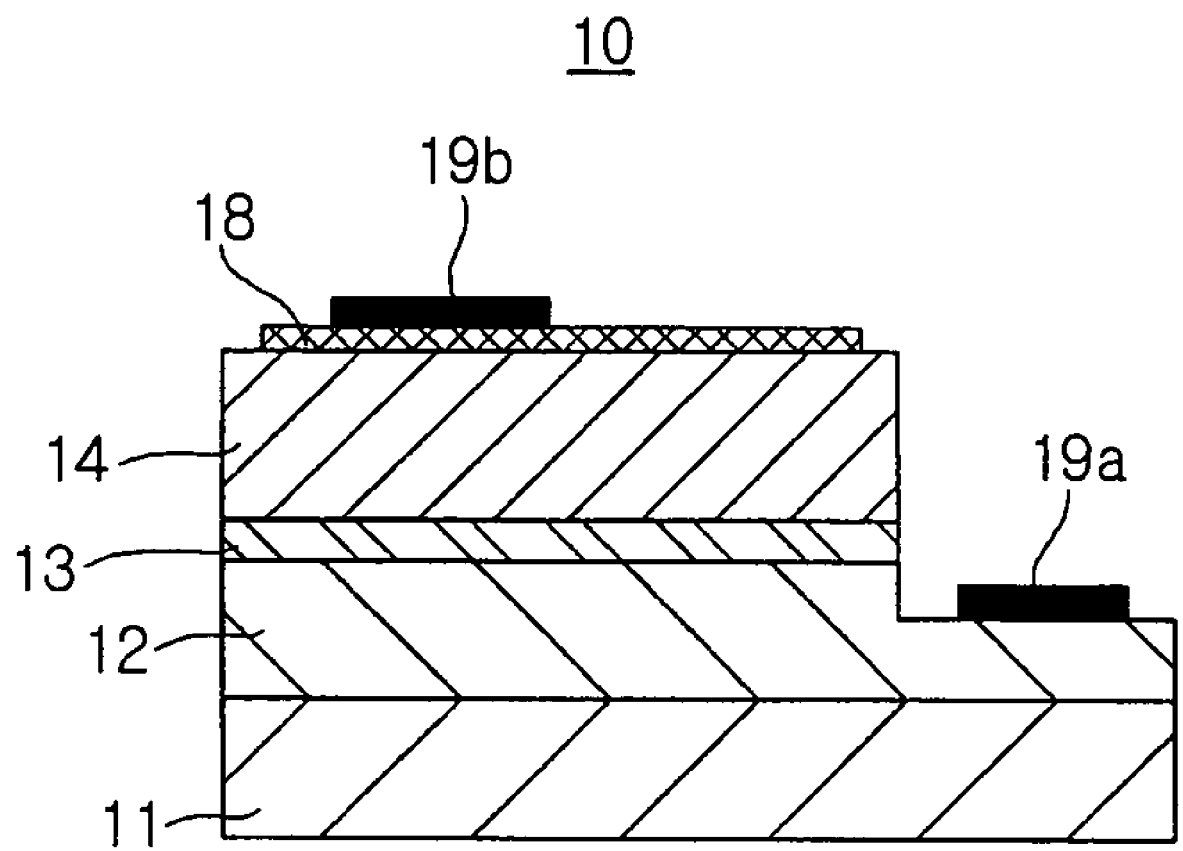
FIG. 1 is a sectional side elevation illustrating a conventional nitride semiconductor light emitting device.

Referring to FIG. 2a, similar to the light emitting device 10 shown in FIG. 1, a nitride semiconductor light emitting device 20 according to the embodiment of the present invention comprises an n-type nitride layer 22, an active layer 23, and a p-type GaN nitride layer 24, which are sequentially formed on a sapphire substrate 21 in this order. The p-type and n-type nitride semiconductor layers 22 and 24 may be a GaN layer and a GaN/AlGaN layer, each having a conductive impurity doped therein, respectively. The active layer 23 may have a multi-quantum well structure consisting of an InGaN/GaN layer.

According to the embodiment of the present invention, in order to reduce contact resistance and to enhance electric current distribution efficiency, a two-dimensional electron gas (2DEG) layer is formed on the p-type nitride semiconductor layer 24. The 2DEG layer may be formed by sequentially forming an undoped GaN layer 25 and an AlGaN layer 26, which are heterogeneous materials, on the p-type nitride semiconductor layer 24. The AlGaN layer 26 may be additionally formed with an ITO electrode 28, and in this case, a p-side electrode 29b is formed on the ITO electrode 28.

Some portion of the p-type nitride semiconductor layer 24, the 2DEG structure 25 and 26, and the active layer 23 is removed to expose a portion of the upper surface of the n-type nitride semiconductor layer 22. An n-side electrode 29a is formed on an exposed region of the n-type nitride semiconductor layer 22.

As shown in FIG. 2b, the undoped GaN layer 25 forms the two-dimensional electron gas layer 27 at an interface with the AlGaN layer 26 due to discontinuity of the energy band with the AlGaN layer 26. Accordingly, when applying a voltage, the tunneling effect is generated by virtue of $n^+$-$p^+$ junction through the two-dimensional electron gas layer 27, thereby lowering contact resistance. Furthermore, high carrier mobility (about 1500 $c^2$/Vs) can be ensured in the two-dimensional electron gas layer 27 of the present invention, thereby remarkably enhancing the electric current distribution efficiency.

According to the present invention, preferable conditions for forming the two-dimensional electron gas layer 27 may be determined by virtue of the thickness t1 and t2 of the undoped GaN layer 25 and the AlGaN layer 26, and of the Al content in the AlGaN layer 26.

More specifically, considering the formation of the 2DEG layer 27 and the tunneling effect, the thickness t1 of the undoped GaN layer 25 is preferably in the range of approximately 10~100 Å. Additionally, although the thickness t2 of the AlGaN layer 26 may be varied depending on the Al content therein, a higher Al content can cause reduction of crystallinity. Accordingly, the Al content of the AlGaN layer 26 is preferably in the range of 10~50%, and under these conditions, the thickness t2 of the AlGaN layer 26 is preferably in the range of approximately 50~250 Å.

In the present invention, as for the AlGaN layer 26 for forming the two-dimensional electron gas layer 27, an undoped AlGaN layer may be used as well as the n-type AlGaN layer. In the case of the n-type AlGaN layer, Si may be used as an n-type impurity.

Furthermore, although the 2DEG layer 27 having the AlGaN/GaN layer can ensure a relatively high carrier concentration ($10^{13}$/Cd), oxygen may be added as an impurity for ensuring a higher carrier concentration. Since oxygen added to the AlGaN layer 26 serves as an electron donor in the same fashion as Si, it increases the doping concentration and maintains the Fermi level, thereby increasing the tunneling effect. Accordingly, oxygen can increase the carrier concentration by increasing the number of carriers supplied to the 2DEG layer 27, thereby greatly enhancing contact resistance.

A method of adding oxygen acting as an electron donor to the AlGaN layer 26 may be realized by environmental oxidation during a process for forming electrodes without an additional process since the AlGaN material has a high reactivity with oxygen. However, in the case where it is necessary to provide a sufficient amount of oxygen, for example, in the case of forming the undoped AlGaN layer 26, it is desirable to perform an additional process for adding oxygen.

Oxygen can be added to the AlGaN layer 26 by performing an annealing process in an oxygen atmosphere after forming the AlGaN layer 26. Particularly, in a specific application, the annealing process can be employed for enhancing crystallinity after forming the AlGaN layer 26, and in this case, oxygen can be easily added thereto without the additional process for adding oxygen by setting the oxygen atmosphere as the atmospheric condition of the annealing process.

As such, according to the present invention, a hetero-junction structure of the GaN/AlGaN layer is formed on the p-type nitride semiconductor layer, thereby remarkably enhancing contact resistance by virtue of the tunneling effect through the 2DEG layer 27. Unlike the conventional structure, this method can enhance the contact resistance and the electric current injection efficiency without forming the transparent electrode having a low transmittance, such as an Ni/Au layer, or excessively increasing the impurity concentration in the p-type semiconductor layer. Additionally, the hetero-junction structure for the 2DEG of the present invention may use only the nitride layer without using the transparent electrode having low transmittance. Preferably, as with the embodiment of the present invention, an ITO electrode having a relatively high transmittance may be employed for ensuring outside-emission efficiency while remarkably enhancing the contact resistance.

FIGS. 3a to 3d are a flow diagram illustrating a method of manufacturing a nitride semiconductor light emitting device according to the present invention.

Figure 3A:
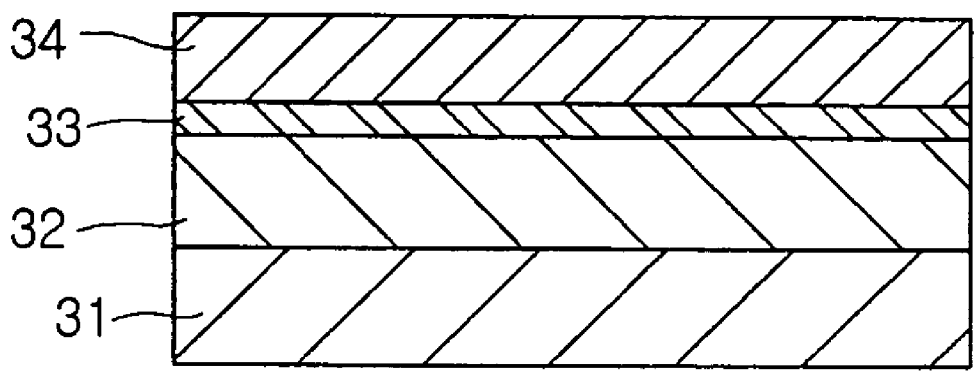
FIGS. 3a to 3d are a flow diagram illustrating a method of manufacturing a nitride semiconductor light emitting device according to one embodiment of the present invention.

First, as shown in FIG. 3a, as the first step in the method of manufacturing the nitride semiconductor light emitting device according to the present invention, an n-type nitride layer 32, an active layer 33, and a p-type GaN nitride layer 34 are sequentially formed on a substrate 31 in this order. The n-type nitride layer 32, active layer 33, and p-type GaN nitride layer 34 may be made of a semiconductor material having the formula $Al_xIn_yGa_{(1-x-y)}N$ (where $0 \leq x \leq 1$, $0 \leq y \leq 1$, $0 \leq x+y \leq 1$), and may be formed by use of well-known nitride deposition processes, such as MOCVD and MBE. The substrate 31 must be appropriate for growing a single crystal of the nitride semiconductor, and may be made of a hetero-substrate, such as a sapphire substrate and a SiC substrate, or a homo-substrate, such as a nitride substrate.

Figure 3B:
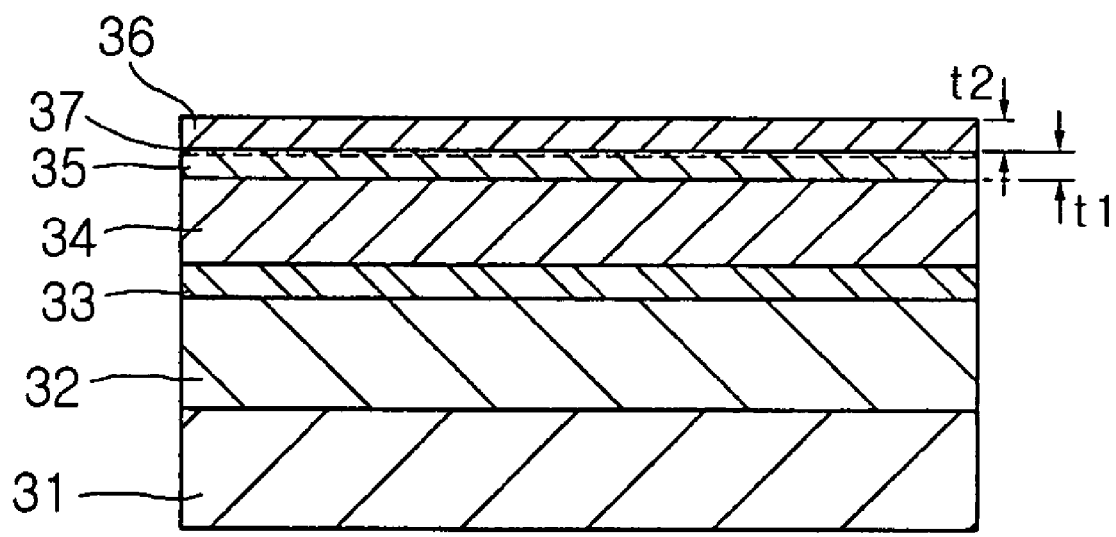

Then, as shown in FIG. 3b, a hetero-junction structure consisting of an undoped GaN layer 35 and an AlGaN layer 36 is formed on the p-type nitride semiconductor layer 34. The undoped GaN layer 35 and the AlGaN layer 36 may be successively formed in a chamber where the nitride deposition process as mentioned above is performed. Furthermore, in order to ensure the tunneling effect by virtue of a two-dimensional electron gas (2DEG) layer, the thickness t1 of the undoped GaN layer 35 is preferably in the range of approximately 10~100 Å, and the thickness t2 of the AlGaN layer 26 is preferably in the range of approximately 50~250 Å, considering a preferable Al content. The Al content of the AlGaN layer 36 is preferably in the range of 10~50% in order to prevent reduction of crystallinity due to an excessive Al content. Additionally, the AlGaN layer 36 may be an n-type AlGaN material comprising Si as an n-type impurity doped therein, but the present invention is not limited thereto. Alternatively, an undoped AlGaN layer may be used.

Figure 3C:
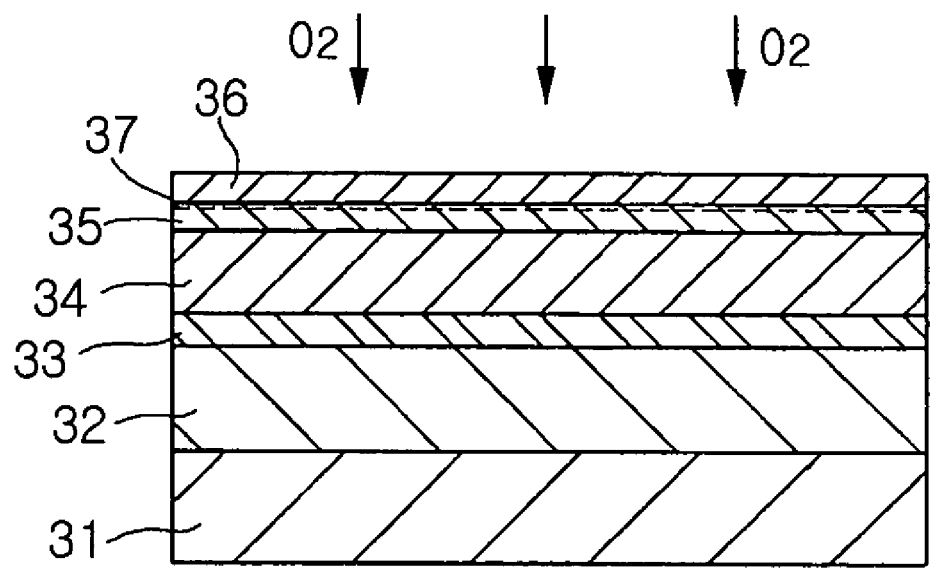
Figure 3D:
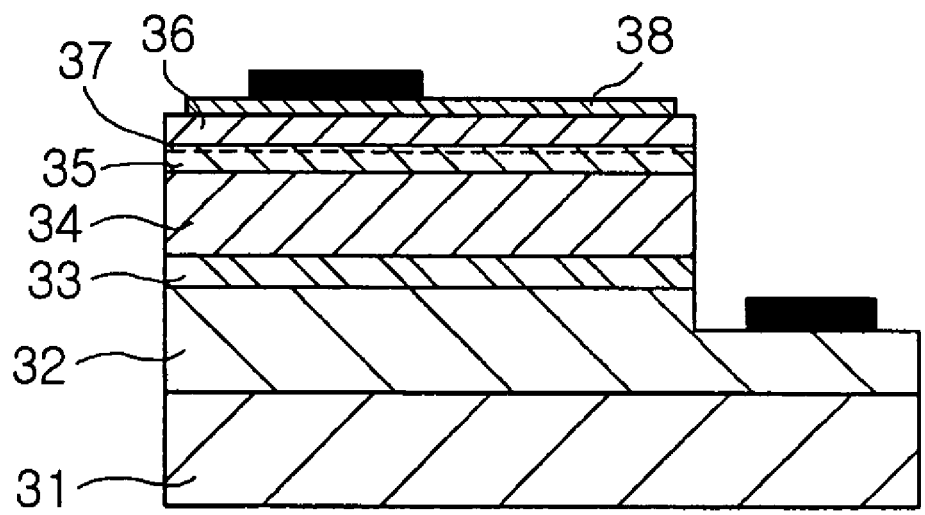

Subsequently, as shown in FIG. 3c, an annealing process for the AlGaN layer 36 grown on the undoped GaN layer 35 may be performed in an oxygen atmosphere. This process is optional, and the amount of oxygen acting as an electron donor is intentionally increased thereby. As described above, the annealing process is generally adopted to enhance crystallinity, and can be easily realized by setting the oxygen atmosphere as the atmospheric condition of the annealing process.

Finally, as shown in FIG. 3c, after a mesa etching process is performed for removing some portion of the p-type nitride semiconductor layer 34, the 2DEG layer structure formed of the AlGaN layer 36 and the undoped GaN layer 35, and the active layer 33 in order to expose a region of the n-type nitride semiconductor layer 32, an n-side electrode 39a and a p-side electrode 39b are formed on the exposed region of the n-type nitride semiconductor layer 32 and the AlGaN layer 36, respectively. As with the embodiment of the present invention, in order to provide appropriate ohmic contact, an ITO electrode having a relatively high transmittance may be formed between the p-side electrode 39b and the AlGaN layer 36. Even with the ITO electrode 38, the contact resistance and the electric current distribution efficiency can be enhanced by virtue of the 2DEG structure, thereby providing excellent electrical characteristics compared with the conventional Au/Ni electrode.

As apparent from the description, according to the present invention, the hetero-junction structure of the GaN/AlGaN is formed on the p-type nitride semiconductor layer, thereby enhancing the contact resistance between the p-type nitride semiconductor layer and the p-side electrode by virtue of the tunneling effect through the 2DEG layer. As the 2DEG layer of the present invention has the higher carrier mobility and carrier concentration, remarkable enhancement of the electrical current injection efficiency can be achieved.

Although the preferred embodiment of the present invention have been disclosed for illustrative purpose, those skilled in the art will appreciate that various modifications, additions and substitutions are possible without departing from the scope and spirit of the invention as disclosed in the accompanying claims.

What is claimed is:

1. A nitride semiconductor light emitting device, comprising:
    an n-type nitride semiconductor layer formed on a substrate;
    an active layer formed on the n-type nitride semiconductor layer;
    a p-type nitride semiconductor layer formed on the active layer;
    an undoped GaN layer formed on the p-type nitride semiconductor layer;
    an n-type AlGaN layer formed on the undoped GaN layer to form a two-dimensional electron gas (2DEG) layer at a bonding interface between the n-type AlGaN layer and the undoped GaN layer; and
    an n-side electrode and a p-side electrode respectively formed on the n-type nitride semiconductor layer and the n-type AlGaN layer to be connected to each other,
    wherein the undoped GaN layer has a thickness of 10~100 Å, the n-type AlGaN layer has a thickness of 50~250 Å, and the n-type AlGaN layer has an Al content in the range of 10~50%.

2. The nitride semiconductor light emitting device as set forth in claim 1, further comprising an ITO electrode between the p-side electrode and the n-type AlGaN layer.

3. A nitride semiconductor light emitting device, comprising:
    an n-type nitride semiconductor layer formed on a substrate;
    an active layer formed on the n-type nitride semiconductor layer;

a p-type nitride semiconductor layer formed on the active layer;

an undoped GaN layer formed on the p-type nitride semiconductor layer;

an AlGaN layer formed on the undoped GaN layer to form a two-dimensional electron gas (2DEG) layer at a bonding interface between the AlGaN layer and the undoped GaN layer; and an n-side electrode and a p-side electrode respectively formed on the n-type nitride semiconductor layer and the AlGaN layer to be connected to each other, wherein the undoped GaN layer has a thickness of 10~100 Å, the AlGaN layer has a thickness of 50~250 Å, and the AlGaN layer has an Al content in the range of 10~50%; and wherein the AlGaN layer comprises oxygen as an impurity.

4. The nitride semiconductor light emitting device as set forth in claim 3, further comprising an ITO electrode between the p-side electrode and the AlGaN layer.

* * * * *